United States Patent
Ciufo et al.

(10) Patent No.: US 9,999,137 B2
(45) Date of Patent: Jun. 12, 2018

(54) METHOD FOR FORMING VIAS ON PRINTED CIRCUIT BOARDS

(71) Applicant: Intrinsiq Materials, Inc., Rochester, NY (US)

(72) Inventors: David Ciufo, Hilton, NY (US); Janet Heyen, Rochester, NY (US)

(73) Assignee: Intrinsiq Materials, Inc., Rochester, NY (US)

( * ) Notice: Subject to any disclaimer, the term of this patent is extended or adjusted under 35 U.S.C. 154(b) by 188 days.

(21) Appl. No.: 14/931,356

(22) Filed: Nov. 3, 2015

(65) Prior Publication Data

US 2016/0128201 A1    May 5, 2016

Related U.S. Application Data

(60) Provisional application No. 62/074,687, filed on Nov. 4, 2014.

(51) Int. Cl.
| | |
|---|---|
| *H01K 3/10* | (2006.01) |
| *H05K 3/40* | (2006.01) |
| *H05K 3/00* | (2006.01) |
| *H05K 3/42* | (2006.01) |
| *H05K 1/03* | (2006.01) |
| *H05K 1/09* | (2006.01) |
| *H05K 3/12* | (2006.01) |
| *H05K 3/22* | (2006.01) |

(Continued)

(52) U.S. Cl.
CPC .......... *H05K 3/4069* (2013.01); *H05K 1/032* (2013.01); *H05K 1/0306* (2013.01); *H05K 1/097* (2013.01); *H05K 3/0047* (2013.01); *H05K 3/1233* (2013.01); *H05K 3/227* (2013.01); *H05K 3/26* (2013.01); *H05K 3/429* (2013.01); *H05K 3/4617* (2013.01); *H05K 2201/0266* (2013.01); *H05K 2201/0347* (2013.01); *H05K 2201/09509* (2013.01); *H05K 2201/09536* (2013.01); *H05K 2201/09563* (2013.01); *H05K 2203/0139* (2013.01); *H05K 2203/085* (2013.01); *H05K 2203/086* (2013.01); *H05K 2203/107* (2013.01); *H05K 2203/1131* (2013.01); *H05K 2203/143* (2013.01); *H05K 2203/1438* (2013.01); *Y10T 29/49165* (2015.01)

(58) Field of Classification Search
CPC ..... H01L 2924/12042; Y10T 29/49155; Y10T 29/49165; Y10T 29/49126; Y10T 29/49163; H05K 2203/025; H05K 1/092; H05K 2201/0959; H05K 1/097; H05K 2201/09563; H05K 3/0047; Y10S 428/901
USPC .......................... 29/852, 825, 829, 846, 851
See application file for complete search history.

(56) References Cited

U.S. PATENT DOCUMENTS

| | | | | |
|---|---|---|---|---|
| 6,125,531 | A | * | 10/2000 | Farquhar .............. H05K 3/0094 29/846 |
| 6,348,295 | B1 | | 2/2002 | Griffith et al. |
| 8,647,979 | B2 | | 2/2014 | Yaniv et al. |

(Continued)

*Primary Examiner* — Thiem Phan
(74) *Attorney, Agent, or Firm* — Louis S. Horvath (57) ABSTRACT

A method for filling a via on a printed circuit board formulates a paste as a dispersion of copper particulate that includes nanocopper particles in a solvent and a binder and depositing the paste into a via cavity formed in the printed circuit board. Heating the paste-filled cavity removes most of the solvent. The method sinters the deposited paste in the via cavity, planarizes the sintered via, and overplates the filled via with copper.

7 Claims, 11 Drawing Sheets

(51) Int. Cl.
  *H05K 3/26* (2006.01)
  *H05K 3/46* (2006.01)

(56) References Cited

U.S. PATENT DOCUMENTS

| | | | |
|---|---|---|---|
| 9,565,748 B2* | 2/2017 | Glickman | H05K 1/0206 |
| 2008/0153242 A1 | 6/2008 | Daniel et al. | |
| 2008/0286488 A1* | 11/2008 | Li | B22F 1/0074 427/541 |
| 2012/0305306 A1 | 12/2012 | Zinn | |

* cited by examiner

METHOD FOR FORMING VIAS ON PRINTED CIRCUIT BOARDS

CROSS REFERENCE TO RELATED APPLICATIONS

This patent application claims the benefit of priority to U.S. Provisional Patent Application Ser. No. 62/074,687, entitled "A METHOD FOR FORMING VIAS ON PRINTED CIRCUIT BOARDS" filed on Nov. 4, 2014 in the names of David Ciufo and Janet Heyen which is hereby incorporated by reference herein in its entirety.

FIELD OF THE INVENTION

This invention relates in general to forming vias for circuit boards and more particularly relates to apparatus and methods for depositing electronic paste into a via cavity and sintering the deposited material to form a filled conductive via.

BACKGROUND

Fabrication of mass-produced electronic items such as printed circuit boards (PCBs) typically involves utilizing both sides of the circuit board as well as using one or more internal layers within a laminated stack of integrated circuit boards. The opposite sides, internal layers, and adjacent stacked boards are electrically connected by means of vias. Vias are holes that are drilled or otherwise formed to provide an electrical path that connects between layers of printed circuit boards. In order to pack a board more densely with components, a "via in pad" strategy is even used, forming the via within a connecting pad in the tracing pattern.

In order for a via to effectively provide a suitable interconnection, the via is typically electroplated or otherwise metallized along its side walls and outer edges. It can be disadvantageous to leave the via hole without some type of filling, however. A simple unfilled via leaves a perforation or hole in the circuit board upon which it is difficult to place an electrical component. Thus, a conductive via fill is useful for component mounting. Copper plating or conductive via fill is also used in order to improve heat dissipation.

There are a number of options for filling a via. Electroplating is one approach that is commonly used for this purpose, but can be costly in terms of time and complexity. The electroplating process requires harsh chemical baths with consequent handling of toxic materials. Electroplating for vias uses a specially designed plating bath and can require as long as 5 hours for a typical board.

As an alternative, PCB fabricators can use a conductive paste for via filling. Commercially available pastes, such as conductive via plug paste CB100 from DuPont Microcircuit Materials, Research Triangle Park, N.C. and conductive pastes from Tatsuta Electronic Materials, Osaka, Japan are epoxy based and can contain some micron-sized copper and silver particulate. Epoxy based pastes, however, have a number of shortcomings. The cost of epoxy-based via fill materials is relatively high, due in part to the silver content. Even with the metal particulate additives, conductivity is significantly below that of bulk copper. Pastes of this type generally have a relatively short working time and must be stored in sub-zero temperatures. Epoxy fillers can also outgas, expand, or contract affecting the integrity of the plated thru hole.

Still other types of non-conductive fillers have been used for via fill, including nonconductive pastes that pack the cavity but do not provide electrical paths or provide any thermal benefit.

Recent advances in printed electronics provide solutions that reduce the cost, complexity, and energy requirements of conventional conductive circuit trace deposition methods and expand the range of substrate materials that can be used for making circuit boards. For printed electronics, materials can be deposited and cured at temperatures compatible with FR4 and plastic substrates and can be handled in air. In particular, advances with nanoparticle-based inks, such as silver, copper, and other metal nanoparticle-based inks, for example, make it feasible to print electronic circuit traces and structures using standard additive printing systems such as inkjet and screen printing systems. Advantageously, nanoparticle-based inks have lower curing temperatures than those typically needed for bulk curing where larger particles of the same material are used.

Commercially available systems for curing nanoparticles typically employ heat from convection ovens or Xenon flash illumination energy. In such illumination systems, the Xenon lamps emit pulsed light that is directed onto films of nanoparticles to be cured. High light energy levels are required for nanoparticle curing. Exemplary nanoparticle-based inks, such as Intrinsiq Material Inc. product CI-003, a copper nanoparticle based inkjet ink, or product CP-003, a copper nanoparticle-based screen print ink, can be sintered through the use of photonic energy from Xenon lamp or other illumination, provided that the illumination system delivers adequate energy to volatilize coatings and additives used in the ink formulations and to sinter and cure the inks over large surface areas. Alternatively, nanoparticles may also be cured by means of laser illumination. The laser provides concentrated energy with a restricted spatial profile, allowing greater penetration of curing energy into the printed paste, thereby allowing higher-resolution features to be formed.

Even with the advances of nanoparticle-based inks and laser energy curing techniques for forming circuit traces, however, via formation remains difficult, time-consuming, and costly. The problem of via fill has not been adequately addressed. It can be appreciated that there is a need for via formation methods that allow improved conductivity and are compatible with methods for printing electronic traces on PCBs.

SUMMARY OF THE INVENTION

It is an object of the present invention to advance the art of fabricating PCBs, with particular attention to forming vias effectively and inexpensively. With this object in mind, embodiments of the present disclosure provide a method for filling a via on a printed circuit board, the method comprising:

formulating a paste as a dispersion of copper particulate that includes nanocopper particles in a solvent and a binder;

depositing the paste into a via cavity formed in the printed circuit board;

removing most of the solvent by heating the paste-filled cavity;

sintering the deposited paste in the via cavity;

planarizing the sintered via; and overplating the filled via with copper.

According to an alternate embodiment of the present disclosure, there is provided a method for forming a conductive via comprising:

drilling a via cavity that extends between at least first and second layers of a printed circuit board;
electroplating walls of the via cavity;
packing a paste into the electroplated via cavity wherein the paste is a dispersion of particles of a conductive metal that includes from 5% to 100% nanoparticles in a solvent and a polymer binder;
removing most of the solvent by oven heating the paste-filled cavity;
sintering the deposited paste in the via cavity using laser energy;
planarizing the sintered via; and
overplating the sintered via with copper.

The conductive paste can be deposited or packed into the via in a number of ways, including: injection, with or without vacuum assist; screen printing; inkjet printing; and packing or compression, such as using a squeegee or other blade.

Sintering the conductive paste can be effected by means of methods including laser illumination; broadband flash illumination; oven sintering in a reducing environment; and oven sintering in an oxygen restrictive environment;

Among advantages provided by embodiments of the present disclosure is the ability rapidly fill and sinter vias. By utilizing oven sintering methods, vias of all types, including through vias and blind vias, can be filled and sintered. The use of the specified conductive pastes ensures high levels of conductivity without causing excessive thermal excursions in the sintering process and consequently damaging the boards. The resulting filled vias are free of any appreciable amounts of organic fillers or epoxies that outgas or are likely to expand or contract during subsequent soldering operations.

These and other aspects, objects, features and advantages of the present invention will be more clearly understood and appreciated from a review of the following detailed description of the preferred embodiments and appended claims, and by reference to the accompanying drawings.

DETAILED DESCRIPTION

The following is a detailed description of the preferred embodiments of the invention, reference being made to the drawings in which the same reference numerals identify the same elements of structure in each of the several figures. It is understood that the elements not shown specifically or described may take various forms well known to those skilled in the art.

Where they are used, the terms "first", "second", and so on, do not necessarily denote any ordinal or priority relation, but may be used for more clearly distinguishing one element or time interval from another.

In the context of the present disclosure, the term "paste" or "ink" is a term of art that broadly applies to a material that is deposited in a pattern on a substrate in a viscous, generally fluid form and is sintered and otherwise cured after deposition by applying a curing energy such as heat or light energy. Ink viscosities compatible with ink jet printing are generally below about 15 centipoise (cP) at printing temperature. By comparison, pastes are understood to have a higher viscosity than inks, so that they can be packed into via cavities and retained in place until dry, for example. Sintering is a curing process by which curing energy effects a structural change in the composition of particles in the paste. Curing may also have additional aspects for paste conditioning, such as sealing or removal of organic coatings, solvents, or other materials provided in the paste formulation but not wanted in the final, printed product. In the context of the present disclosure, the term "curing" is used to include sintering as well as other curing processes that apply heat energy, such as using light energy, for conditioning the deposited paste.

The terms "nanoparticle-based material", "nanoparticle-based ink", "nanoparticle-based paste", "nanoparticle material", or "nanoparticulate material" refer to a paste or an ink or other applied viscous fluid that has an appreciable amount of nanoparticulate content, such as more than about 5% by weight or volume. The copper or other conductive metal in a nanoparticle-based ink or paste can be as much as 100% nanoparticles or may contain some percentage of nanoparticles with micron-sized particulate.

In the context of the present disclosure, the term "substrate" refers to any of a range of materials used for the printed circuit board upon or into which the nanoparticle paste is deposited for curing. Exemplary substrates include plastics, textiles, paper, sheet materials, and other non-conductive materials that provide a suitable surface for depositing a pattern of nanoparticle-based paste. The term "printed circuit board" has its conventional meaning as understood by those skilled in circuitry fabrication, and indicates a section of the substrate on which electronic components can be mounted and upon which conductive traces can be extended for interconnection between component leads. The printed circuit board can be in an unfinished state, such as being drilled and metal-plated but not yet having traces formed, or in a more completed state, such as having one or more circuit traces formed on it, for example. As a final step in conventional printed circuit board fabrication, the leads of various types of electronic components are set in place and soldered onto mounting positions on the printed circuit board.

As used herein, the term "energizable" relates to a device or set of components that perform an indicated function upon receiving power and, optionally, upon receiving an enabling signal.

A composite or multilayer printed circuit board can consist of many layers and can have both back and front metallization, typically referred to as circuit traces but also alternately including ground planes and other metallization structures. To create a via, holes are drilled into the board and the internal walls are electroplated or otherwise metallized. Basic types of vias are shown for a printed circuit board (PCB) 10 in FIG. 1 and include thru-vias 12 that extend fully between outer surfaces 14 and 16 of the circuit board, whether the PCB 10 has a single board 20 in a single-layer arrangement or is formed as a stack of multiple boards 20, capable of having conductive traces on internal layers. Via types where multiple boards 20 are used include blind vias 18 that penetrate to specified depth in the stack and stop, and buried vias 22 that exist only in intermediate layers of the stack and are not accessible from outer surfaces 14, 16.

By "conductive" is meant herein any material capable of allowing flow of electric charge in the material sufficient to provide electrical current between components in an electronic circuit, irrespective of the conductivity mechanism or conductivity type of the material. In the context of the present disclosure, vias are formed in materials that are non-conductive and are not formed within or from various types of semiconductors.

In the context of the present disclosure, nanoparticle size refers to actual geometric size, as determined, for example, by Transmission Electron Microscopy. Copper nanoparticles useful for the purposes of the disclosure can include those having diameters less than 500 nm. In some embodiments, copper nanoparticles as small as 20 nm are useful. The inventive copper nanoparticulate pastes may comprise nanoparticles having substantially monodisperse copper nanoparticle size distributions. Other embodiments may comprise copper nanoparticles characterized by polydisperse size distributions having sizes substantially within the stated limits.

Nanoparticle Paste Formulations

In general, nanoparticle-based pastes of conductive materials are suitable for via fill applications. Suitable metals for printing and curing in a pattern and used to form vias and other structures include, but are not limited to, copper, gold, silver, nickel, and other metals and alloys.

The nanoparticle paste used in embodiments of the present disclosure comprises the metal nanoparticles and microparticles with a binder or coating (typically organic). The binder or coating in the paste helps to prevent agglomeration and to maintain the surface area, which confers many of the advantageous properties of nanoparticles. The nanoparticles used in the paste formulation can have diameters between 0.5-500 nm. Advantageously, therefore, the method described herein can be implemented for a wide range of nanoparticle pastes including those with a percentage of larger particles, which are often cheaper to produce. An example of a suitable paste is the commercially available CP-007, a copper-based screen printing paste sold by Intrinsiq Materials, Rochester, N.Y. As noted previously, pastes need not be comprised solely of nanoparticles, but may contain a mix with at least some percentage of nanoparticles, as described previously, and larger particles.

The high surface area of the nanoparticles is advantageous, so that the energy required to transform the nanoparticles in the paste, such as to fuse particles together by sintering or curing, is less than what is needed for bulk materials of larger particle size. Therefore, as the laser illumination or other applied heat energy not only removes the coating or binding materials in the paste formulation, it also causes a transformation of the material. Under appropriate heat conditions, the individual metal nanoparticles bond to form a metal structure, in the form of a densified metal film (depending on the material of the nanoparticle paste).

Laser energy has advantages for curing nanoparticle-based fluids. As laser illumination can be focused to a small spot size, the metal structure that is formed is localized to areas impacted by the laser. The high degree of accuracy with which the laser can be directed results in the formation of high resolution printed structures.

Each deposited material or paste can have different curing properties, responding differently to light of various wavelengths and intensities. Where multiple materials are deposited on the same board, it may be suitable to cure the different materials under the same conditions or to vary wavelength and intensity levels appropriately.

Formulation requirements for an acceptable via filling paste according to an embodiment include a resin formed using a solvent or solvents with a suitable polymer binder; nano-particle copper, also termed "nanocopper"; and alternately some percentage of micron sized copper particles. In particularly suitable embodiments, nanocopper particles may make up 5 to 100% of the copper in the paste, while the total copper loading, by weight, may be from 50 to 90% of the paste material. Ratios of nanocopper to micron-sized copper particulate can be adjusted in order to adapt to application factors such as via size and geometry, fill mechanisms, and sintering technique. Higher proportions of nanoparticles can be advantageous for filling vias of very small diameter, for example.

In the context of the present disclosure, the term "resin" is defined as a material having a binder component and a solvent. In the processing that is described herein, the solvent component is substantially dissipated and removed by heating and sintering, so that only the binder component remains after sintering. Resin formulation is largely determined by the sintering technique that is to be used. The resin must be able to be degraded in the sintering process so that the solvent component is effectively removed following sintering; any remaining resin can tend to act as an insulator. Common resin embodiments use some suitable type of organic polymer as a binder. Resins in the dispersion may include, as binders, polymers such as PVP, poly propylene carbonate, and ethyl cellulose.

Solvents may include organic solvents such as ethylene glycol, diethylene glycol monobutylether, glycerol, dipropylene glycol, and other glycol ethers and esters, Terpineol, acetone, propylene carbonate, methyl ethyl ketone, alcohols such as ethanol, butanol, diacetone alcohol, 1-methoxy-2-propanol, 2-methoxyethanol, and 3-methoxy-3-methyl-1-butanol.

Solvent selection is determined by factors including: (1) compatibility with the selected binder; (2) sufficient viscosity, so that the resulting rheology of the paste is compatible with the via filling process selected; and (3) volatility properties, since too volatile a solvent will allow insufficient working time, and too non-volatile a solvent will result in excessive drying times. Volatility considerations vary, depending on the heating and sintering energy levels that are applied. Resin formulation considerations and selection based on these factors involve judgment steps well known to those skilled in the art.

Nanocopper particles may optionally be encapsulated to prevent oxidation, as may the micron sized particles. Encapsulation can be provided by a polymer, for example. Useful polymers for this purpose include, but are not limited to, polyvinylpyrrolidone (PVP), polyvinyl alcohol, methyl cellulose, polyethylene glycol, polyacids such as polyacrylic acid, polymethylmethacrylate, polymaleic acid, and the like.

Additional additives that affect sintering temperature such as glass frit or supplemental particles can be added.

Examples of particles include particles and nanoparticles formed from bismuth oxide, tin, indium tin oxide, lead, bismuth, alumina, copper oxide, and titanium.

The paste that is formed is shear thinning with viscosities in the range of 5-30 Pascal-seconds measured at a 50 l/sec shear rate. Viscosity within this range enables the paste to meet the needs of deposition methods that are currently employed for filling the PCB via cavity. A low viscosity ink, by comparison, cannot be packed into the via cavity that is drilled into a printed circuit board and cannot properly fill the cavity for subsequent drying and sintering processes. Typical via cavity sizes for printed circuit board applications that use conventional, epoxy-based via fill materials generally range from 100 to 1000 microns, with larger diameters in some cases; however, smaller vias can be formed on some types of substrate, depending in part on the via drilling technique. Advantageously, unlike epoxy-based via fill materials, the shelf life of the formulated paste can be measured in months or even years without special storing conditions such as vacuum or refrigeration.

Printed circuit board substrates can be any of a number of types of materials. Most common are rigid boards of FR4, and flexible boards of Kapton. The via fill process is compatible with laminate materials identified in specification IPC-4101 "Specification for Base Materials for Rigid and Multilayer Printed Boards" from IPC, Bannockburn, Ill.

Compatible PCB materials include, but would not be limited to, the following:
  Di-Functional & Multi-Functional FR-4 Epoxy resin systems;
  Polyimide Resin Systems;
  Filled Epoxy Systems;
  PTFE Resin Systems;
  Polyimide based Flex and Rigid Flex;
  High Performance Epoxy Systems;
  Hybrid Combination Materials; and
  Most Rigid High Performance Resin Systems.

Embodiments of the present disclosure are advantaged over conventional via formation practices for use with flexible substrates. Particular features that support forming vias on multilayer boards formed from flexible substrates include ease of planarization and high conductivity.

Using an embodiment of the present disclosure, via formation is generally independent of conductive trace and pad formation used for the PC board. An exemplary process for filling and sintering a via is depicted in the flow chart of FIG. 2 and shown schematically for thru-via 12 in FIGS. 3A through 3F. In a drill step S100, the via cavity is drilled out using a mechanical drilling process or is otherwise formed in the PCB. In an electroplate step S110, via walls are electroplated, thereby forming a cylindrical, plated via cavity 26. In an injection or plugging step S120, the via cavity is packed, filled with the conductive via fill paste through one of several mechanisms, such as those described herein.

Figure 3A:
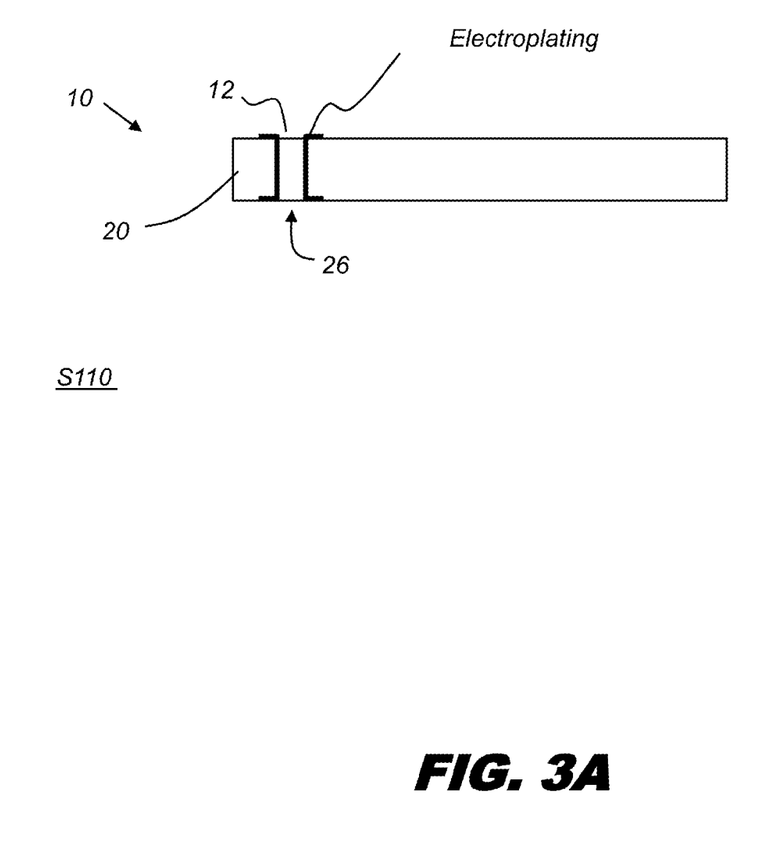
FIG. 3A is a simplified schematic side view that shows forming and electroplating a via.
Figure 3B:
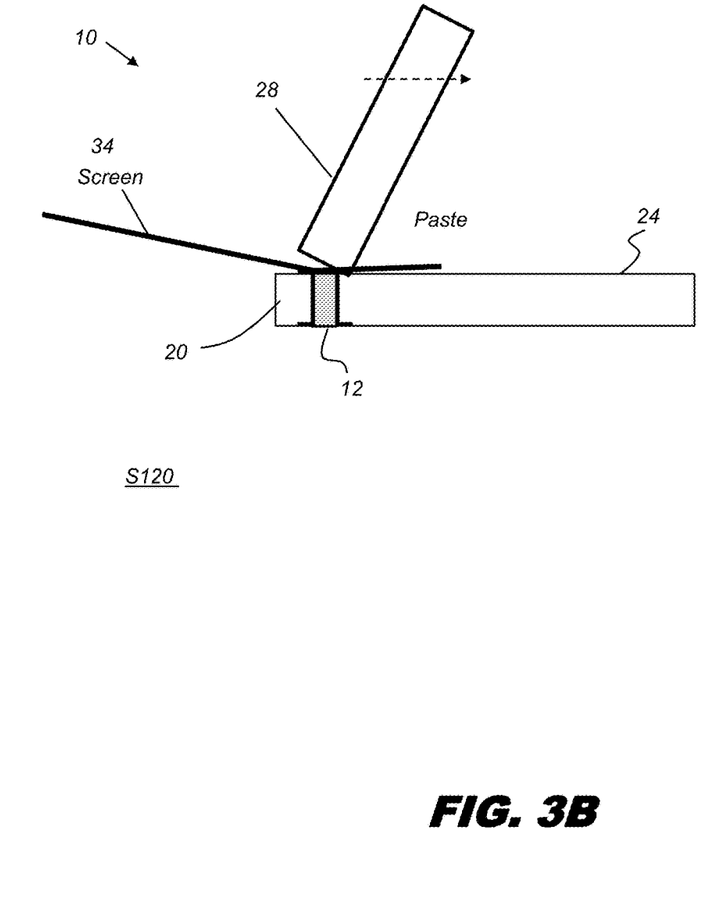
FIG. 3B is a simplified schematic side view that shows injection of paste into a via cavity using a squeegee or blade.

Shown in FIG. 3B is a screen printing approach to via filling in injection step S120 whereby the viscous paste is scraped across a surface 24 and over the plated via cavity 26; the paste is urged across and against the surface in front of a squeegee 28 or other type of blade to force, compress, pack, or squeeze the paste into the via. An optional screen 34 can be provided. Alternately, any of a number of methods used for via filling could be used, including the use of vacuum heads for vacuum assist and including squeegee or other blade types. The basic paste is also compatible with standard via fill techniques such silk screen, and stencilprint, with or without vacuum assist. The paste can be injected into the vias by stencil patterned application devices, by screen printing. Via fill paste can be applied using inkjet printing under some conditions and formulations, such as for shallow vias and where applied heat at the inkjet head can temporarily reduce paste viscosity to allow inkjet flow and dispersion, for example, but where the drops of softened paste harden quickly enough to remain in place against the plated via cavity. However, inkjet application is not generally well suited to paste application, due largely to viscosity factors, as can be well appreciated by those skilled in the inkjet printing arts.

Additional approaches for paste application in injection step S120 include roll coating, and double-offset squeegee, with or without vacuum assist. A combination of vacuum and pressure on opposite ends of the via can also be used for packing the paste into the via cavity 26. Injection from a needle or other orifice can alternately be used to fill the via cavity 26 with the viscous paste.

Figure 2:
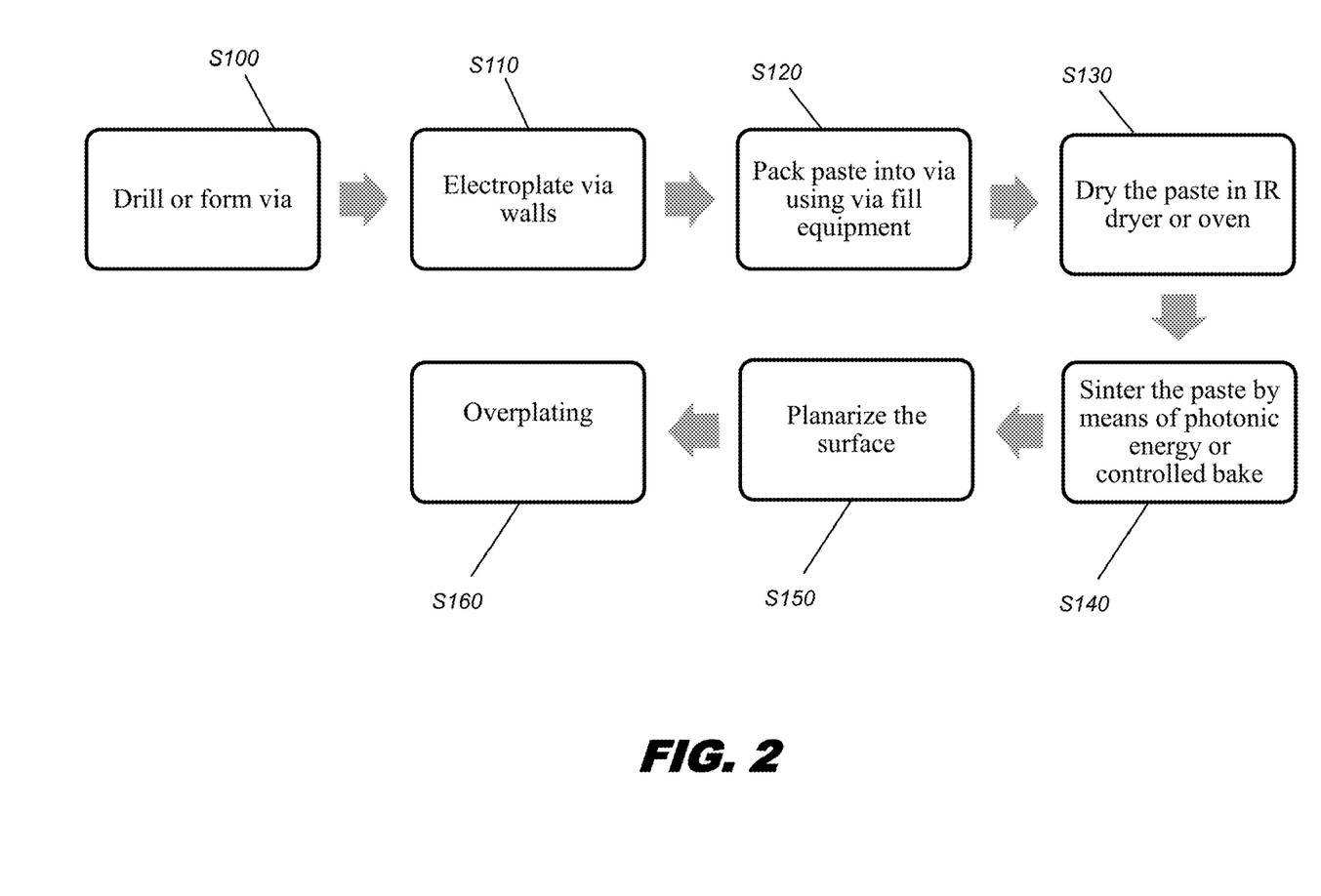
FIG. 2 is a process flow diagram that shows the sequence for via fills according to an embodiment of the present disclosure.
Figure 3C:
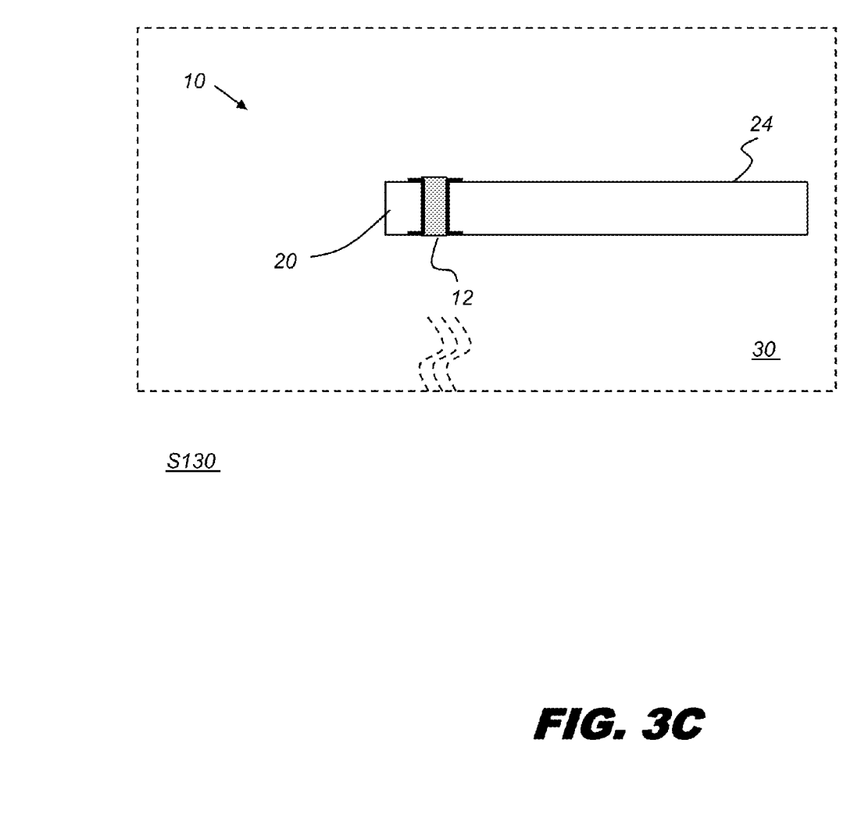
FIG. 3C is a simplified schematic side view that shows a drying process for the via paste.

Referring back to the process shown in FIG. 2, once filled, the via is dried in a drying step S130 in order to remove the bulk of the solvent, as shown in FIG. 3C. Drying can be accomplished a variety of ways that are conventionally used, including using an IR oven, a conveyor dryer, or a standard laboratory or fabrication facility oven. In processing, some slight overfilling of the vias may be allowable, since this can be corrected in subsequent steps.

Figure 3D:
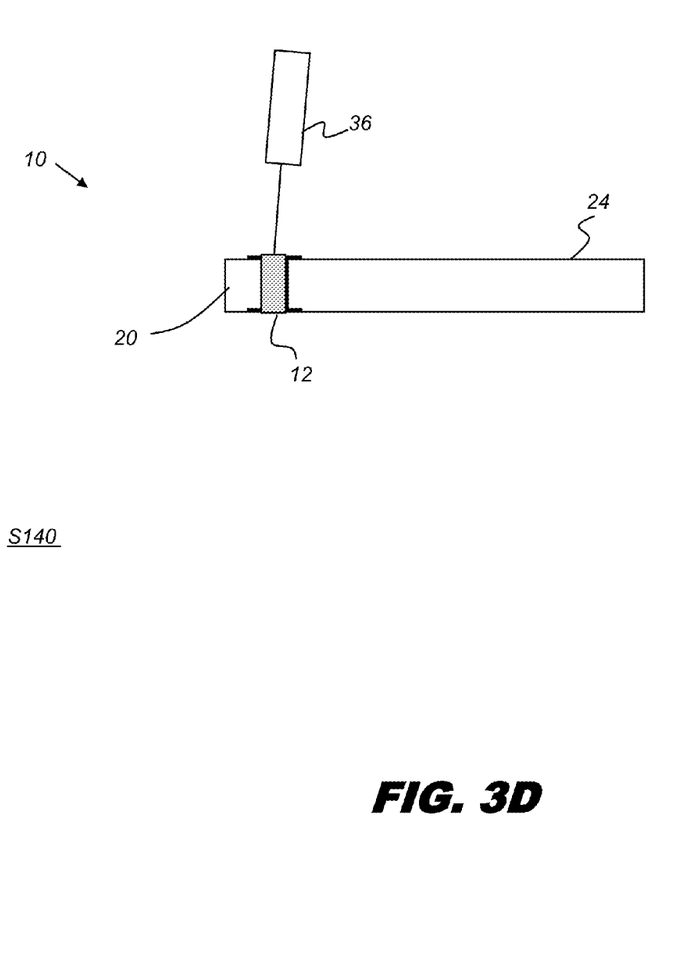
FIG. 3D is a simplified schematic side view that shows a sintering step using a laser.

After drying, the vias can be sintered in a sintering step S140. Sintering the via is the process of volatilizing any remaining solvent and at least some portion of the polymer contents to remove them from the deposited paste, and fusing the remaining metal particles together to form a solid metal structure with the needed structural strength, adhesion to neighboring metallization and plated via cavity walls, and conductivity. Sintering can be accomplished photonically by means broadband flash lamp or laser. Broadband flash is particularly useful when filling vias on flexible or thin substrates such as Kapton. For thru-vias, broadband flash can be applied from opposite sides of the printed circuit board. For these materials, the heat penetration depth is fairly shallow so that the lower cost broadband, broad area illumination is adequate. As the relative depth of the via increases, the use of an IR laser 36 becomes more advantageous, due to factors such as increased penetration depth for the applied heat energy. Attempting to use broadband energy over the full board surface in order to provide sufficient sintering energy proves to be inefficient and can damage the board substrate or distort board shape or surface smoothness in some way.

Figure 4:
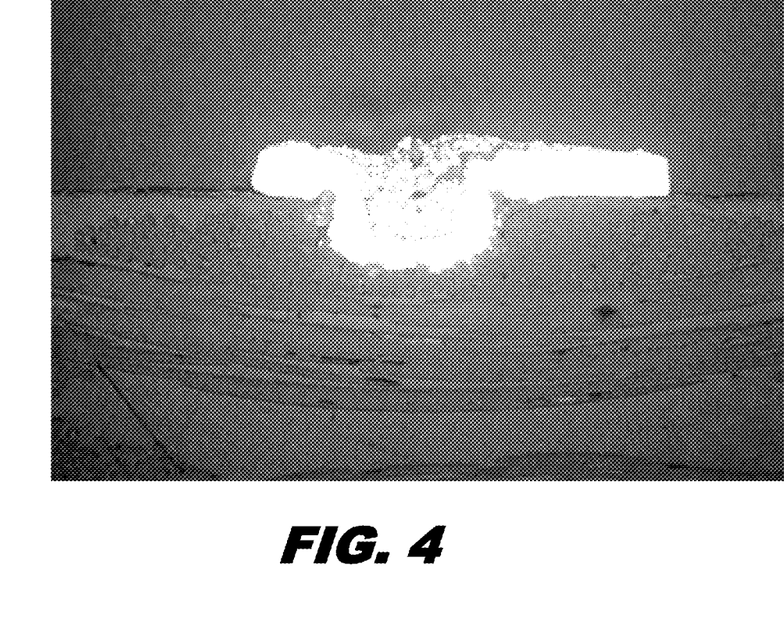
FIG. 4 shows a filled via on a non-clad board.

IR lasers at 808 to 1064 nm (such as diode lasers, or fiber coupled lasers) have demonstrated sintering success for curing pastes with the formulation described above. Lasers are particularly useful for clad boards. Copper clad boards require higher laser energy, as the copper cladding can tend to conduct heat away from the paste before it is sintered. Prior to sintering, the electroplated walls of the via cavity may conduct, but the applied paste itself is not conductive. Once sintered, the via is conductive. Shown in FIG. 4 is a plan view of a sintered via 12 on an unclad board.

An alternate method for sintering the paste is oven sintering of the filled via. Baking is useful particularly for curing filled vias formed in copper clad boards and for more complex via arrangements, such as for buried vias. Oven sintering using a conveyor can be used, such as for providing an even heat distribution over the substrate surface.

Figure 5:
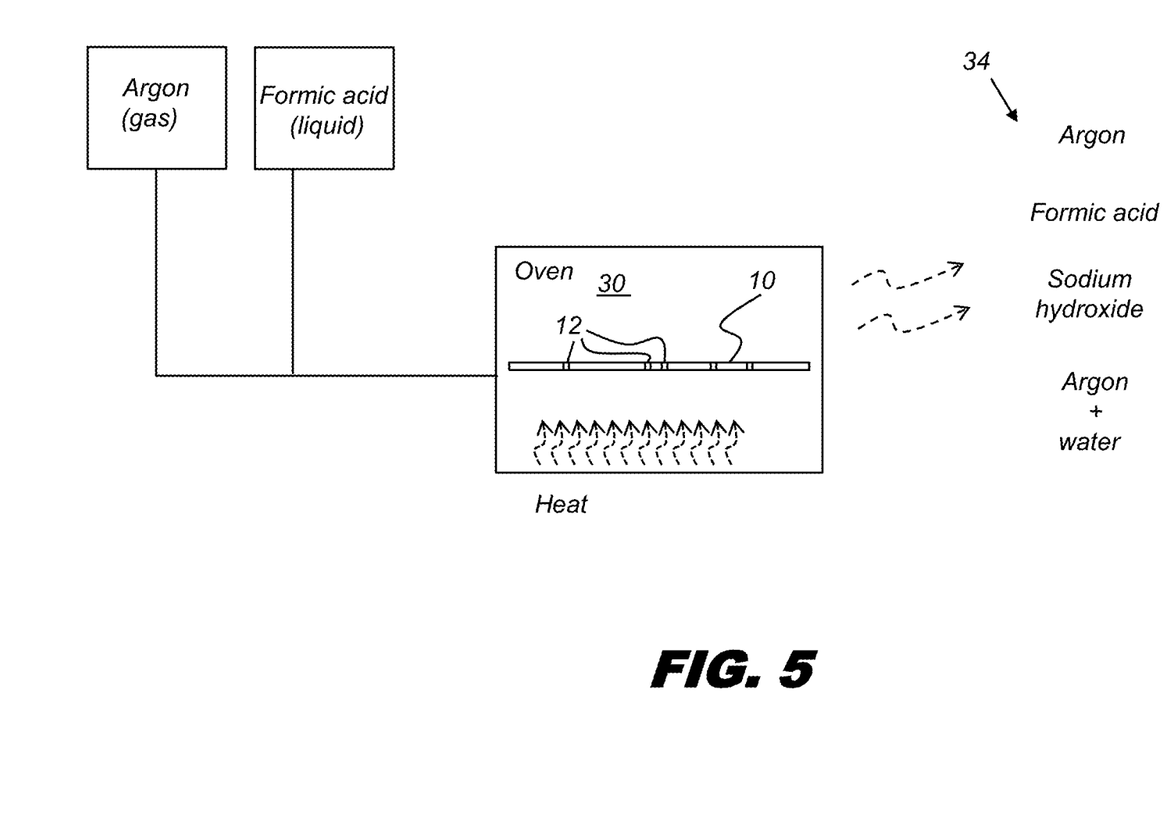
FIG. 5 shows oven processing for a circuit board with filled, uncured vias.

There are several approaches to sintering using an oven, including baking for approximately 1 hour at less than or equal to 225 degrees C. in a non-oxidative environment, such as in a reducing environment such as formic acid in argon or other inert gas to prevent oxidation. FIG. 5 depicts an oven process utilizing the formic acid environment. The temperature needs to be maintained below levels that would damage the printed circuit boards 10. It may not always be necessary to maintain a baking environment that is as stringent as that shown. A reducing environment is highly advantageous for sintering. Sintering can also be accomplished in a hot nitrogen flow, or baking with hydrogen/nitrogen flow. Precautions are taken to help reduce the risk of oxidation of the copper fill paste, which would reduce conductivity. Sufficient heat energy must be applied, however. If the via is not properly sintered, the paste can wash away during cleaning/wash processing.

The paste formulation is non-conductive until it is sintered. In addition, the paste has no appreciable adhesion properties until it is sintered into copper.

The resulting paste once sintered is typically $\frac{1}{10}^{th}$ to $\frac{1}{6}^{th}$ the conductivity of bulk copper, making the process suitable for via formation. By using the paste formulated as described herein as a via fill, the via formation process forms a via of metallic copper, without residual epoxy fillers or other unwanted by-products. Embodiments of the present disclosure achieve conductivity results in the range of 5× to 20× the bulk resistivity of pure copper. By comparison, most conductive epoxies for via fill provide conductivity in the range from about 20× to 50× the bulk resistivity of pure copper.

Using conventional epoxies, the cross-linked epoxy resins provide the supporting structure for the via fill. Using the method of the present disclosure, on the other hand, the sintered copper provides the supporting structure.

Figure 3E:
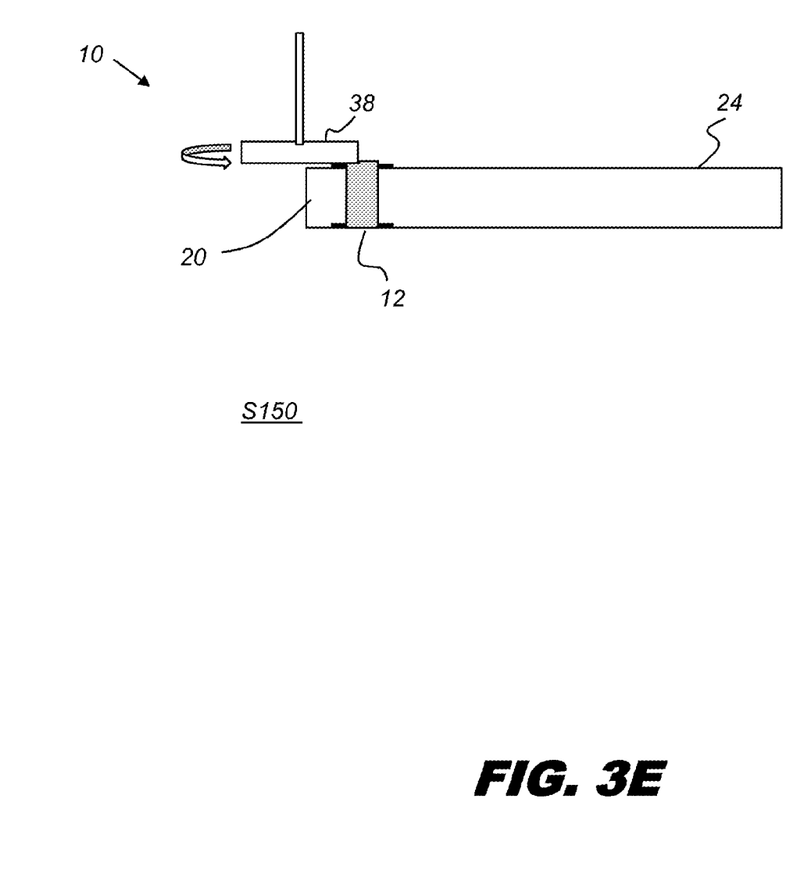
FIG. 3E is a simplified schematic side view that shows a planarization step for the sintered via.
Figure 3F:
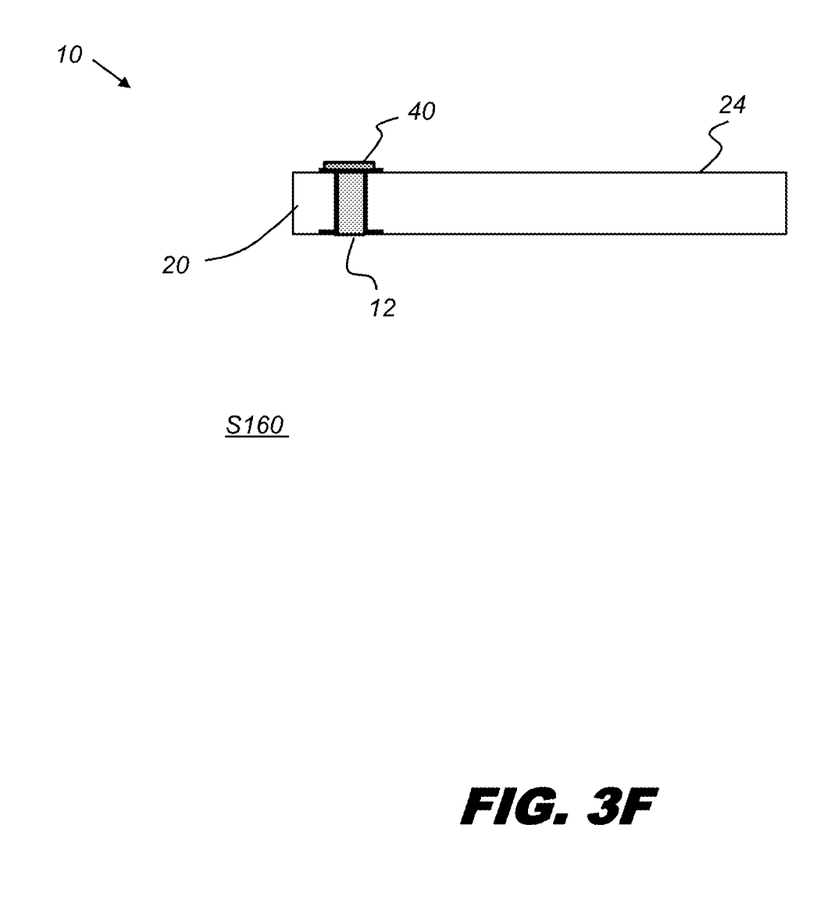
FIG. 3F is a simplified schematic side view that shows an overplating step.

Referring back to the process sequence of FIG. 2, steps that follow sintering step S140 are a planarization step S150 as shown in FIG. 3E and an overplating step S160 as shown in FIG. 3F. Planarization, shown using a grinding tool 38 to level the surface of the filled via to the board surface, helps to conform the newly formed via 12 to the PCB surface and surface morphology. Typical planarization methods use various types of orbital brushes, ceramic brushes, surface grinding, or belt sanding apparatus, for example. Unlike cross-linked cured epoxy via fills, the sintered paste of the present disclosure can be efficiently removed without smearing. This reduces the likelihood of removal of surface copper from around the via area as a result of aggressive planarization methods.

Figure 6:
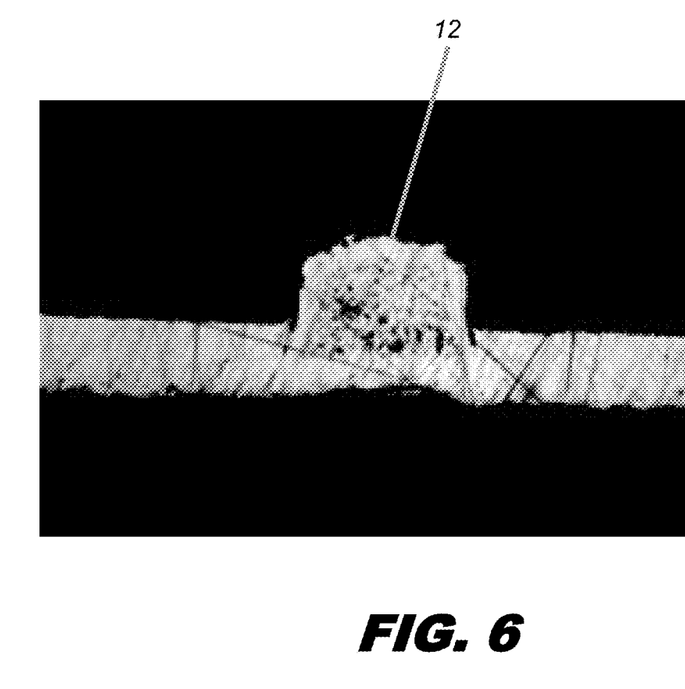
FIG. 6 shows a planarized, overplated via formed according to an embodiment of the present disclosure.

Planarization and over-plating help to conform the newly formed vias to the surface and to surface morphology, and improve characteristics such as ability to serve as surface contacts for soldering, for example. In addition, samples must endure multiple temperature excursions with sufficient solidity in the vias to avoid rapid destructive outgassing. The sintering process provides a via filled with pure copper, eliminating the need to repeat an electroless plating process in order to apply overplating 40 in many cases. Additional surface treatments are typically not needed in order to promote adhesion for overplating. According to an embodiment of the present disclosure, a coating or other ink deposition method is used to deposit overplating material, having copper nanoparticles and having lower viscosity than the paste formulation used for vias, on top of the filled via 12. This deposition is followed by a separate overplating process, such as sintering the nanoparticle ink or using some other method to provide copper overplating. Shown in FIG. 6 is a filled and sintered via 12 after overplating.

Figure 1:
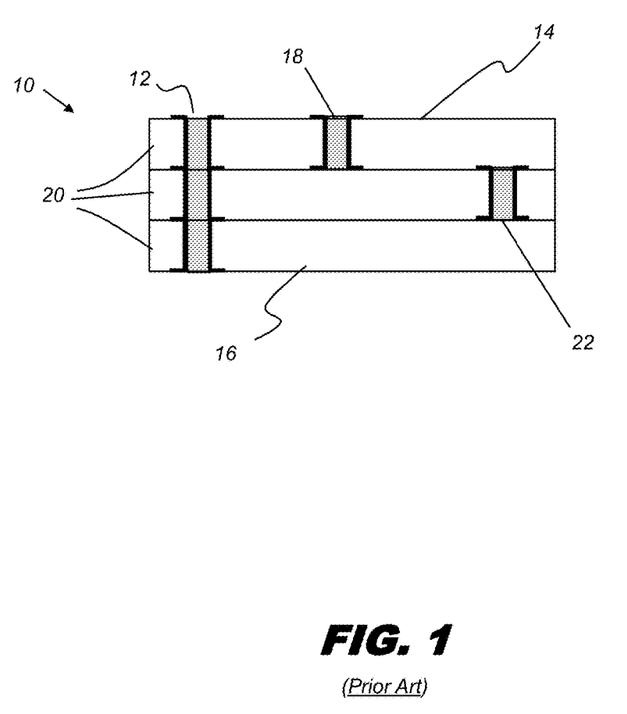
FIG. 1 is a side view that shows basic types of vias.

In board processing, vias can be filled during any time they are created. For multilayer boards, buried vias are drilled on each layer in the stack, then filled so that they can be used as a pad to capture laser drilling from above after lamination. Blind vias are created after lamination of the multi layer and may be filled, as well as thru holes.

Where a via extends through multiple boards 20 in a multilayer stack, as shown at the furthest left via in FIG. 1, the full via 12 can be formed in a single deposition and curing step. Alternately, a portion of the full via can be formed on one of the boards 20, then the via can be extended with the addition of one or more boards 20 in the multilayer stack, repeating the deposition, drying, and curing process a number of times until the full via is formed.

Using the method and formulations described herein has advantages over epoxy formulations and eliminates the need for very difficult electroplating in order to obtain solid copper vias for reliability and conductivity. The vias formed using embodiments of the present disclosure are not cross-linked; instead, a portion of the polymer constituents of the via fill material are typically burned off or otherwise dissipated by the heat of the curing process.

The inventors have found the present method particularly suitable for a number of additional substrates including PET, PI, PE, PP, PVA, PI, SiN, ITO and glass. Therefore, it is believed that the method of the present disclosure provides an improved method for producing high resolution trace and via features, compared against other systems. In particular, the direct transformation (curing, sintering or otherwise) of the material by a laser allows for higher resolution features, reduces or avoids the need for adding further layers such as photoresist layers and requires fewer stages for producing vias than do conventional methods. Advantageously, the process described herein is readily scalable. Printing and curing of electronic materials and components can be performed at low volumes as well as for large-scale, high volume production. Results have shown via structures having up to 5 times or greater conductivity than with current epoxy-based solutions.

EXAMPLE

According to an embodiment of the present disclosure, PCBs having a number of vias were prepared and processed using the methods described hereinabove.

The via fill material was a paste having copper nanoparticle and micron-sized particulate in the ratio of 1:1, with copper loading of 70% nominal by weight, in a solvent that includes A-Terpineol, approximately 25% by weight, with polyvinyl butyral as an organic binder.

The vias on the PCB were filled using a squeegee blade and dried in a vacuum oven at a nominal temperature of about 50 degrees C. for one hour. The PCB was then sintered in an oven at temperatures ranging from about 190 to 225 degrees C. for one hour under a reducing environment. The filled vias were then planarized, and overplated with copper using non-electroless plating.

An IPC solder float test was performed on finished over-plated vias. The float test was executed over 5 cycles, with 10 seconds at 550 degrees F., allowed to cool to ambient between floats. Results showed successful via formation, with conductivity properties much improved over those obtained using conventional epoxy-filled vias.

The invention has been described in detail with particular reference to certain preferred embodiments thereof, but it will be understood that variations and modifications can be effected within the scope of the invention.

The invention claimed is:

1. A method for forming a via on a printed circuit board, the method comprising:

formulating a paste as a dispersion of copper particulate that includes, in a solvent and a binder, 50 to 90 percent by weight of combined nanocopper and micron-sized copper particles, wherein the nanocopper particles are from 5% to 99% of the metal in the dispersion;

depositing the paste into a via cavity formed in the printed circuit board;

removing most of the solvent by heating the paste-filled cavity;

sintering the deposited paste in the via cavity;

planarizing the sintered via; and overplating the filled via with copper.

2. The method of claim 1 wherein sintering the paste comprises directing laser energy onto the deposited paste.

3. The method of claim 1 wherein sintering the paste is performed using an oven in a non-oxidative environment.

4. The method of claim 1 wherein formulating the paste further comprises using nanocopper particles encapsulated with a polymer.

5. The method of claim 1 wherein formulating the paste comprises using an organic solvent.

6. The method of claim 1 wherein formulating the paste comprises using a polymer binder.

7. The method of claim 1 wherein overplating comprises depositing a nanoparticle ink having a lower viscosity than the paste onto the planarized via and sintering the nanoparticle ink.

* * * * *